(12) United States Patent
Aoi et al.

(10) Patent No.: US 12,089,388 B2
(45) Date of Patent: Sep. 10, 2024

(54) COMPOSITE MATERIAL STRUCTURE

(71) Applicant: MITSUBISHI HEAVY INDUSTRIES, LTD., Tokyo (JP)

(72) Inventors: Tatsufumi Aoi, Tokyo (JP); Kazuki Yamawaki, Tokyo (JP); Akio Ikeda, Tokyo (JP); Hisashi Shimizu, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 244 days.

(21) Appl. No.: 17/721,913

(22) Filed: Apr. 15, 2022

(65) Prior Publication Data

US 2022/0338394 A1 Oct. 20, 2022

(30) Foreign Application Priority Data

Apr. 19, 2021 (JP) .................. 2021-070580

(51) Int. Cl.
| | |
|---|---|
| *H02H 1/00* | (2006.01) |
| *H02G 13/00* | (2006.01) |
| *H02H 1/04* | (2006.01) |
| *H02H 3/22* | (2006.01) |
| *H02H 9/06* | (2006.01) |
| *H05K 9/00* | (2006.01) |

(52) U.S. Cl.
CPC ........... *H05K 9/0088* (2013.01); *H02G 13/80* (2013.01); *H05K 9/002* (2013.01)

(58) Field of Classification Search
CPC ....... H05K 9/0088; H05K 9/002; H02G 13/80
USPC ........................................................ 361/117
See application file for complete search history.

(56) References Cited

U.S. PATENT DOCUMENTS

| | | | |
|---|---|---|---|
| 2008/0169828 A1* | 7/2008 | Brady | .................... G01N 27/24 324/675 |
| 2010/0086729 A1* | 4/2010 | Long | ...................... B32B 15/08 428/116 |
| 2014/0117022 A1* | 5/2014 | Ackerman | .......... B29C 65/5021 156/60 |

(Continued)

FOREIGN PATENT DOCUMENTS

WO 2014/070313 5/2014

*Primary Examiner* — Jared Fureman
*Assistant Examiner* — Lucy M Thomas
(74) *Attorney, Agent, or Firm* — Wenderoth, Lind & Ponack, L.L.P.

(57) ABSTRACT

A composite material structure includes: a first composite material member including a first reinforcing fiber that is electrically conductive and impregnated with a first resin; a second composite material member including a second reinforcing fiber that is electrically conductive and impregnated with a second resin; an adhesive layer disposed between the first composite material member and the second composite material member to bond the first composite material member to the second composite material member; and an electromagnetic shielding member covering at least part of an area, exposed to an exterior, of the adhesive layer. At least one of the first and second composite material members has a predefined lightning current direction in which a lightning current generated by a lightning strike passes. The shielding member is disposed over an entire plane of a side face in a direction orthogonal to the lightning current direction.

4 Claims, 7 Drawing Sheets

(56) References Cited

U.S. PATENT DOCUMENTS

2014/0306164 A1\* 10/2014 Restuccia ................ C08K 3/04
   252/511

\* cited by examiner

COMPOSITE MATERIAL STRUCTURE

CROSS-REFERENCE TO RELATED APPLICATIONS

The present application claims priority to and incorporates by reference the entire contents of Japanese Patent Application No. 2021-070580 filed in Japan on Apr. 19, 2021.

FIELD

The present disclosure relates to a composite material structure.

BACKGROUND

Conventional composite laminate structures are known that include structural bond lines for joining two fiber-reinforced plastic resin laminates (see, for example, International Publication WO2014/070313, hereinafter WO '313). A structural bond line has electric impedance that substantially matches that of the two laminates. The structural bond line includes, for example, a scrim of carbon fiber impregnated with an adhesive resin. Such a structural bond line can reduce the effects of a lightning strike on the structural bond line and to reduce electrical potential generated on the exposed structural bond line. This can reduce use of sealant to cover exposed areas of the bond line, resulting in a reduction in weight and manufacturing cost of an aircraft.

The structural bond line in WO '313, however, requires adjustments related to materials that are used or for assembly in order to match the impedance, which may complicate the work and reduce the work efficiency. In addition, in the case that, for example, a lightning strike causes a current to pass through a common composite material bonding structure, the current generates induced electromotive force. The induced electromotive force, which has been generated, may generate a potential difference around a joint and cause dielectric breakdown at the joint.

An object of the present disclosure is to provide a composite material structure that can reduce generation of a potential difference around an adhesive layer even if, for example, a lightning strike causes a lightning current to pass, and can achieve an improvement in lightning resistance of the adhesive layer in a simple configuration.

A composite material structure according to the present disclosure includes: a first composite material member including a first reinforcing fiber that is electrically conductive and impregnated with a first resin; a second composite material member including a second reinforcing fiber that is electrically conductive and impregnated with a second resin; an adhesive layer disposed between the first composite material member and the second composite material member to bond the first composite material member to the second composite material member; and an electromagnetic shielding member covering at least part of an area, exposed to an exterior, of the adhesive layer. At least one of the first composite material member and the second composite material member has a predefined lightning current direction in which a lightning current generated by a lightning strike passes. The electromagnetic shielding member is disposed over an entire plane of a side face serving as an end face of the composite material structure in a direction orthogonal to the lightning current direction.

Advantageous Effects of Invention

The present disclosure can reduce generation of a potential difference around a joint even if, for example, a lightning strike causes a lightning current to pass, and can achieve an improvement in lightning resistance of the joint in a simple configuration.

DESCRIPTION OF EMBODIMENTS

Embodiments of the present disclosure will now be described in detail with reference to the accompanying drawings. It should be noted that the invention is not limited by these embodiments. The component(s) of the embodiments, which will be described below, include those that are readily replaceable by a person skilled in the art or substantially the same. Furthermore, the components below can be appropriately combined. If there is a plurality of embodiments, the embodiments can be combined.

First Embodiment

Figure 1:
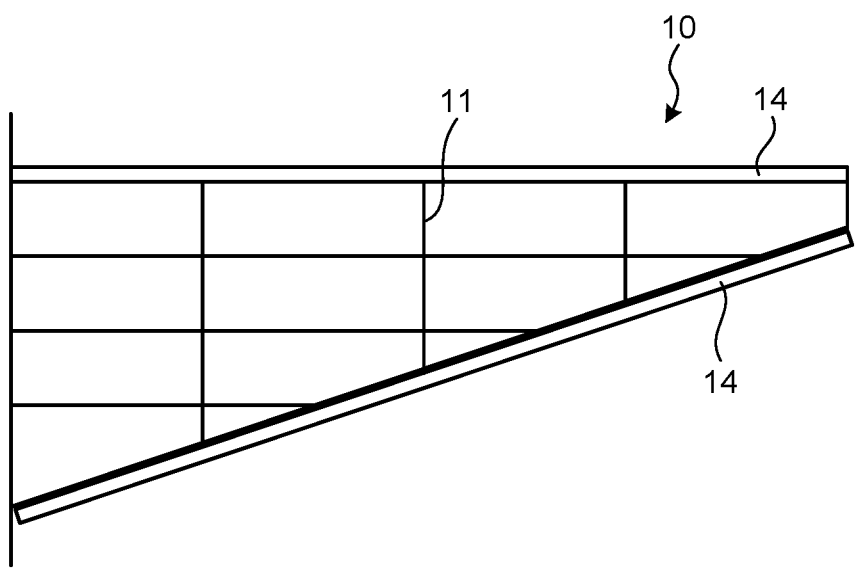
FIG. 1 is a schematic configuration diagram of a wing employing a composite material structure according to a first embodiment.

FIG. 1 is a schematic configuration diagram of a wing employing a composite material structure according to a first embodiment. FIGS. 2 to 8 are schematic perspective views of examples of the composite material structure according to the first embodiment. The composite material structure, which will be described below, is illustrated as being used in a main wing of an aircraft in FIG. 1, although not limited to the main wing of the aircraft. Alternatively, the composite material structure can be employed in, for example, an automobile, a vehicle, a ship, or any other structure.

Composite Material Structure

Figure 2:
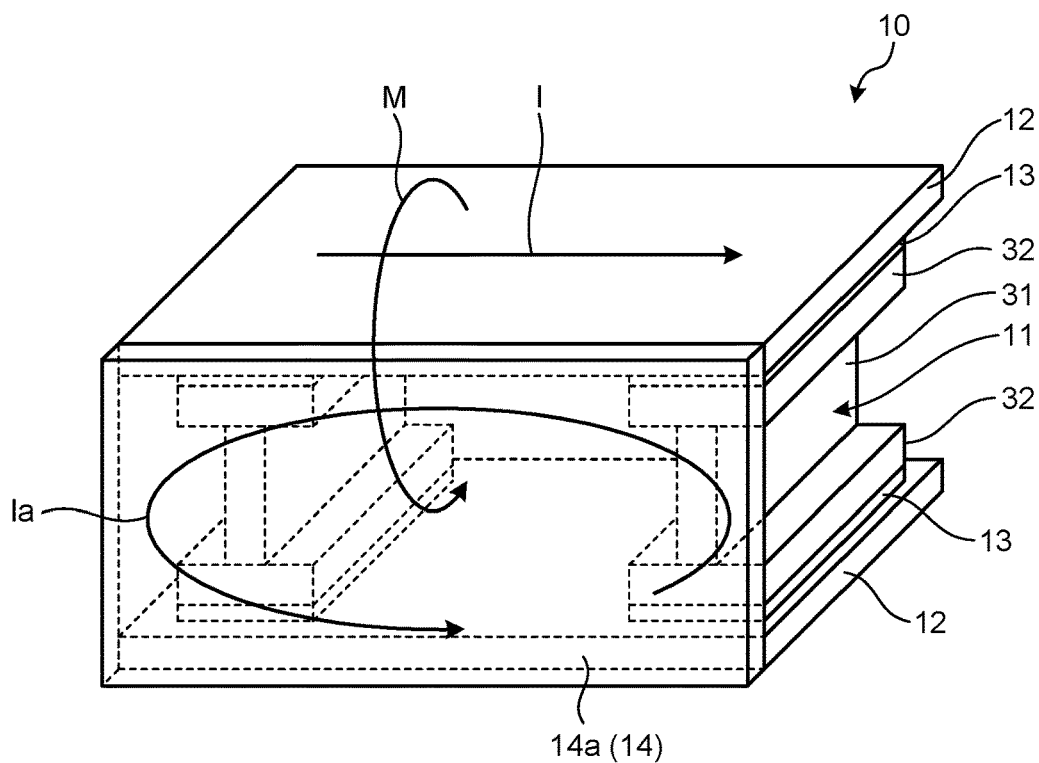
FIG. 2 is a schematic perspective view of an example of the composite material structure according to the first embodiment.

As illustrated in FIGS. 1 and 2, a composite material structure 10 is employed in, for example, a main wing of an aircraft. The composite material structure 10 includes a first composite material member 11, second composite material members 12, adhesive layers 13, and electromagnetic shielding members 14. For the main wing as the composite material structure 10, the horizontal direction in FIGS. 1 and 2 indicates the lengthwise direction (wing span direction), the superior-inferior direction in FIG. 1 (the anterior-posterior direction in FIG. 2) indicates the transverse (width chord direction) orthogonal to the length direction, the anterior-posterior direction in FIG. 1 (the superior-inferior direction in FIG. 2) indicates the thickness direction (wing thickness direction) orthogonal to the lengthwise and transverse directions. The composite material structure 10 has a predefined lightning current direction in which a lightning current generated by a lightning strike passes. The lightning current direction is in the lengthwise direction. The main wing, for example, has a box beam structure including stringers disposed in the lengthwise direction, ribs disposed in the transverse direction, and skin disposed on upper and lower faces, of the main wing, in the thickness direction. In the composite material structure 10 or main wing, the first composite material member 11 is employed in, for example, the ribs of the main wing. The second composite material members 12 are employed in, for example, the skin of the main wing.

As illustrated in FIG. 2, the first composite material member 11 includes a first reinforcing fiber that is electrically conductive and a first resin soaked into the first reinforcing fiber. The first resin may cover the first reinforcing fiber. The first composite material member 11 is, for example, a column with an I-shaped cross-section. Specifically, the first composite material member 11 is an I-shaped cross-sectional column because a web 31 disposed over an entire plane including the transverse and thickness directions is integrated with a pair of flanges 32 disposed on both sides of the web 31 in the thickness direction. The web 31 is disposed over an entire plane perpendicular to the lightning current direction. The flanges 32 are disposed opposite the second composite material members 12 being the skin and are each shaped into a plate. The first composite material member 11 is not limited to have the I-shaped cross-section and may have any shape so long as the first composite material member 11 is connectable to the second composite material members 12 and has integrated faces.

The second composite material members 12 each includes a second reinforcing fiber that is electrically conductive and a second resin soaked into the second reinforcing fiber. The second resin may cover the second reinforcing fiber. The second composite material member 12 is disposed opposite the flange of the first composite material member 11 and has a plate shape. The second composite material member 12 is not limited to have a plate shape and may have any shape connected to the first composite material member 11 and an integrated face.

Both the first and second reinforcing fibers are illustrated that each include a bundle of several hundred to several thousand elementary fibers of 5 μm to 7 μm. Preferred examples of the elementary fibers constituting the first and second reinforcing fibers include electrically conductive carbon fibers and metal fibers. Glass fibers, aramid fibers, and plastic fibers, besides the first and second reinforcing fibers that are electrically conductive may be mixed into the first and second composite material members 11 and 12.

Examples of both the first and second resins include epoxy resins, polyester resins, and vinyl ester resins that contain thermosetting resins as the main components. The first and second resins may be mixed with thermoplastic resins besides the thermosetting resins. Examples of the thermoplastic resins that are mixed include polyamide resins, polypropylene resins, acrylonitrile butadiene styrene (ABS) resins, polyether ether ketone (PEEK), polyether ketone ketone (PEKK), and polyphenylene sulfide (PPS). The first and second resins are not limited to these, and other resins may be used.

In the case that the resin that soaks into the reinforcing fiber is a thermosetting resin, the thermosetting resin can be in a softened state, a cured state, or a semi-cured state. The thermosetting resin before being thermally cured is in the softened state. The thermosetting resin in the softened state is not self-supportable and cannot retain its shape if not being supported by a support. The thermosetting resin in the softened state can be heated into a thermosetting reaction. The thermosetting resin after being thermally cured is in the cured state. The thermosetting resin in the cured state is self-supportable and can retain its shape even if not being supported by a support. The thermosetting resin in the cured state cannot be brought into a thermosetting reaction even if being heated. The semi-cured state is a state between the softened state and the cured state. The thermosetting resin in the semi-cured state is weakly cured compared to the cured state. The thermosetting resin in the semi-cured state is self-supportable and can retain its shape even if not being supported by a support. The thermosetting resin in the semi-cured state can be heated into a thermosetting reaction. Hereinafter, an intermediate substrate for the composite material including a reinforcing fiber impregnated with an uncured thermosetting resin is appropriately referred to as a prepreg.

The adhesive layers 13 are each disposed between the first composite material member 11 and the second composite material member 12. The adhesive layer 13 bonds the flange 32 of the first composite material member 11 to the second composite material member 12, which oppose each other, to integrate the first composite material member 11 with the second composite material member 12. The adhesive layer 13 has bonding faces bonding the first composite material member 11 and the second composite material member 12. The periphery of the bonding faces is an area exposed to the exterior.

Figure 3:
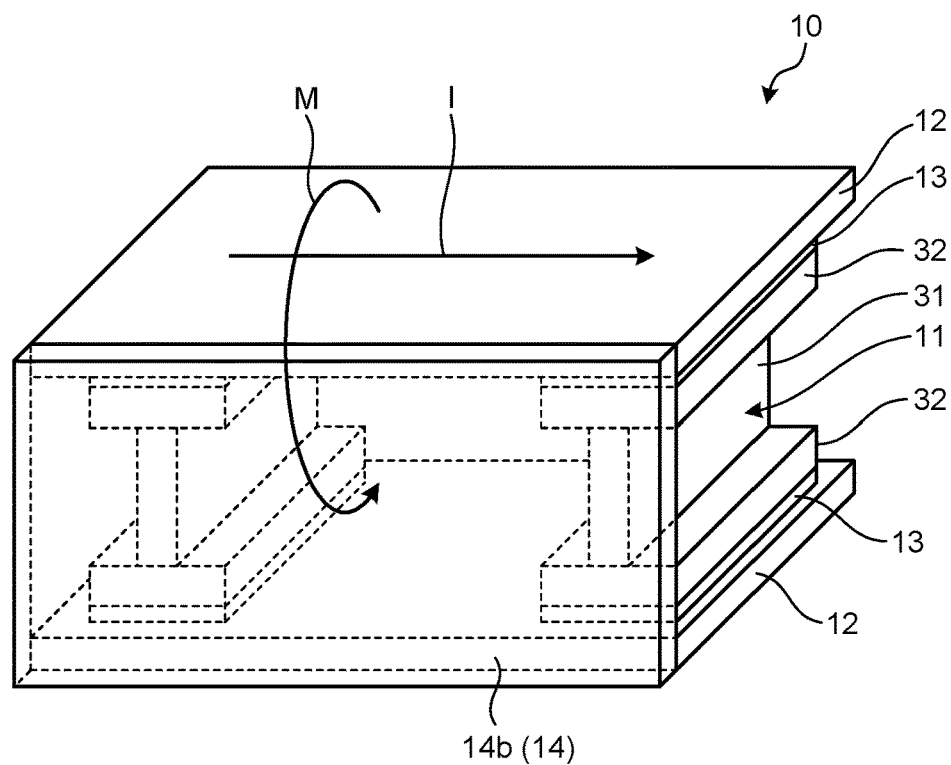
FIG. 3 is a schematic perspective view of an example of the composite material structure according to the first embodiment.

The electromagnetic shielding members 14 each cover at least a part of the area exposed to the exterior of the adhesive layer 13. Specifically, as illustrated in FIGS. 2 and 3, the electromagnetic shielding member 14 is disposed over an entire plane of a side face serving as an end face of the composite material structure 10 (i.e., the electromagnetic shielding member 14 covers an entire end face of the composite material structure 10) in the transverse direction orthogonal to the lightning current direction. The electromagnetic shielding member 14 can be installed within the side face by retrofitting. The electromagnetic shielding member 14 has a sheet-like shape and is disposed over the entire side face. Examples of the electromagnetic shielding member 14 include metal plates, metal meshes, and coating layers formed by applying conductive paints. Examples of the conductive paints include resinous paints mixed with powders or fibers of metal materials having high conductivity, such as Ag and Cu.

FIG. 2 illustrates the electromagnetic shielding members 14 each including a conductive material allowing an induced current Ia induced by a lightning current I to pass, for example, a plate or a mesh made of a metal material having high conductivity, such as Al, Cu, or Ti. Passage of the lightning current I in the lightning current direction causes a magnetic field M to be generated around the lightning current I. The induced current Ia induced by the magnetic field M, which has been generated, passes through the electromagnetic shielding members 14. The electromagnetic shielding member 14 can form a path for the induced current Ia around the adhesive layer 13 (due to the electrically insulating quality of the adhesive layer 13) and thus reduce generation of a potential difference around the adhesive layer 13.

FIG. 3 illustrates the electromagnetic shielding members 14 each including a magnetic material that shields the magnetic field M induced by the lightning current I. For example, the material is a plate made of a magnetic material having high permeability, such as permalloy. Although passage of the lightning current I in the lightning current direction causes the magnetic field M to be generated around the lightning current I, the generated magnetic field M is shielded by the electromagnetic shielding member 14. The electromagnetic shielding member 14 can reduce magnetic coupling and thus generation of a potential difference around the adhesive layer 13.

Figure 4:
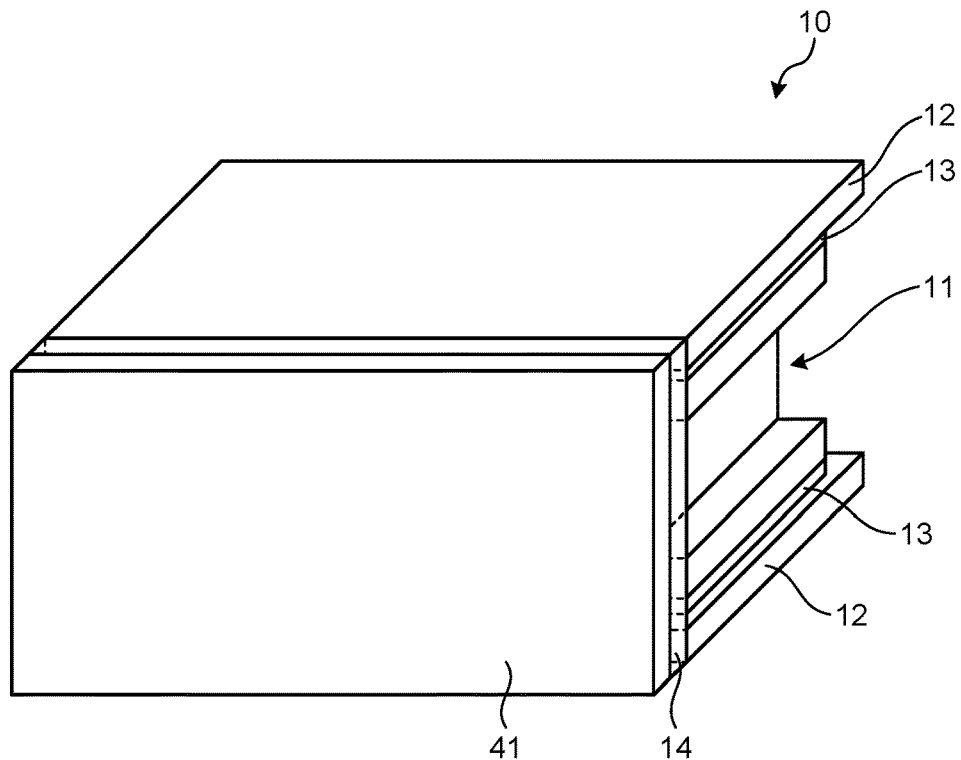
FIG. 4 is a schematic perspective view of an example of the composite material structure according to the first embodiment.
Figure 5:
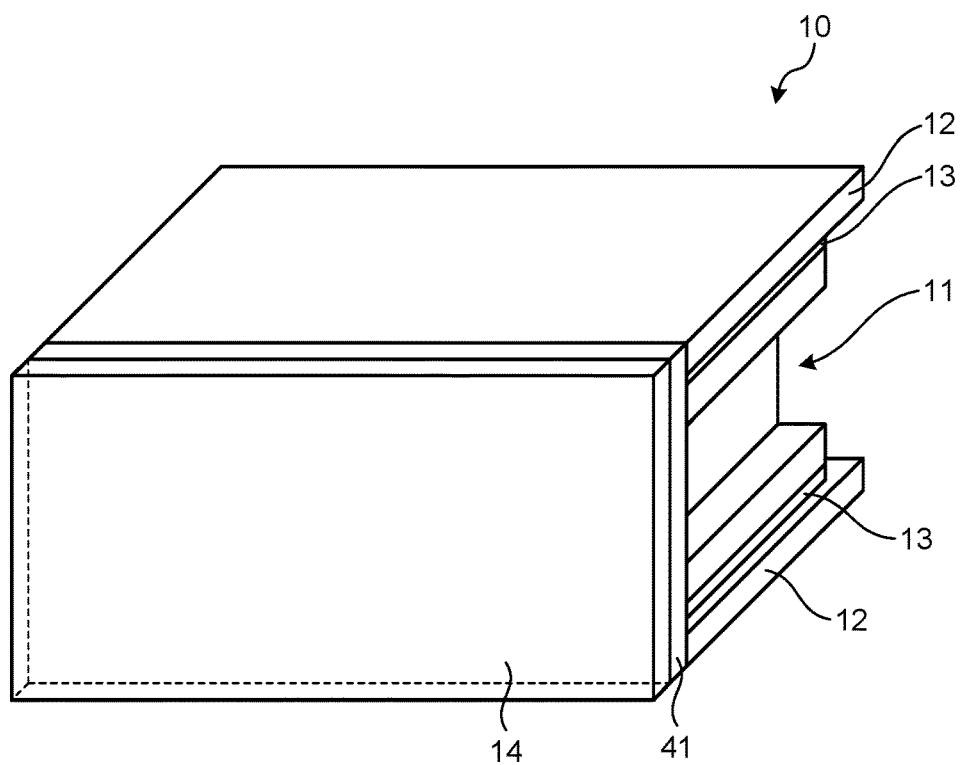
FIG. 5 is a schematic perspective view of an example of the composite material structure according to the first embodiment.

Another example of the composite material structure 10 will now be described with reference to FIGS. 4 and 5. The composite material structure 10 further includes side panels 41 disposed on both side faces in the transverse direction. The electromagnetic shielding members 14 and the side panels 41 are stacked and disposed in the transverse direction. In this case, the side panels 41 may be disposed outside and the electromagnetic shielding members 14 may be disposed inside (adjacent to the adhesive layers 13), as illustrated in FIG. 4. In the layout illustrated in FIG. 4, the electromagnetic shielding members 14 are in contact with the adhesive layers 13. As illustrated in FIG. 5, the electromagnetic shielding members 14 may be disposed outside and the side panels 41 may be disposed inside (adjacent to the adhesive layers 13). In the layout illustrated in FIG. 5, the electromagnetic shielding members 14 are not in contact with the adhesive layers 13.

Still another example of the composite material structure 10 will now be described with reference to FIGS. 6 to 8. While the electromagnetic shielding members 14 in FIGS. 2 to 5 are disposed over the entire side faces, the electromagnetic shielding members 14 in FIGS. 6 to 8 are disposed on the partial side faces.

Figure 6:
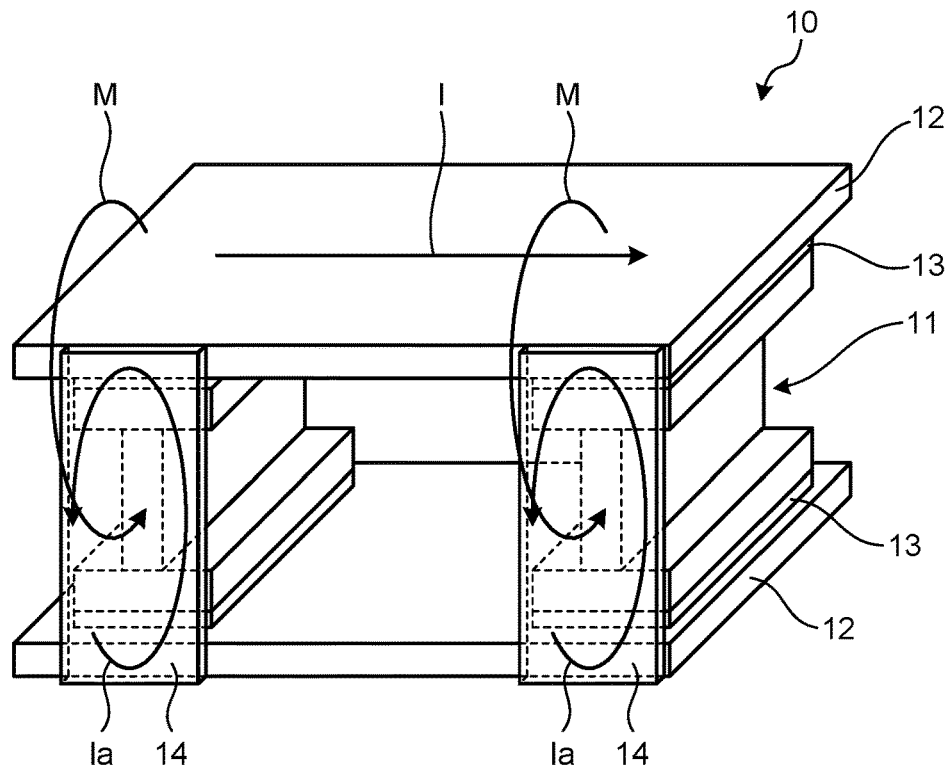
FIG. 6 is a schematic perspective view of an example of the composite material structure according to the first embodiment.

In FIG. 6, the electromagnetic shielding members 14 are disposed in the lengthwise direction in regions where the adhesive layers 13 are disposed, while not being disposed in the lengthwise direction in regions where the adhesive layers 13 are not disposed. The electromagnetic shielding members 14 are disposed in the thickness direction.

Figure 7:
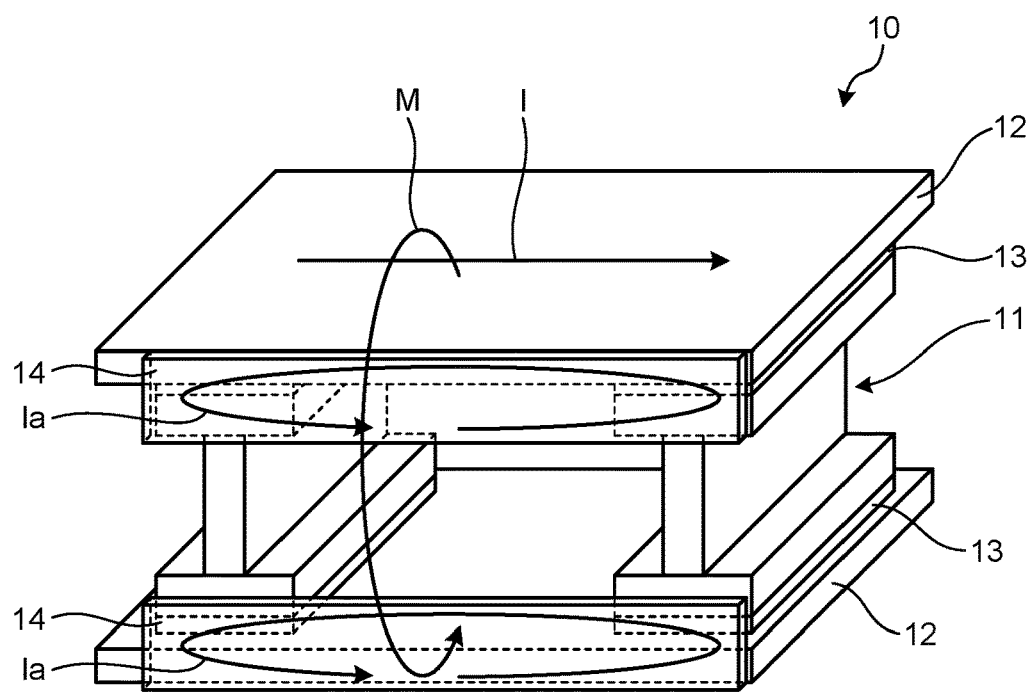
FIG. 7 is a schematic perspective view of an example of the composite material structure according to the first embodiment.

In FIG. 7, the electromagnetic shielding members 14 are disposed in the thickness direction in regions where the adhesive layers 13 are disposed, while not being disposed in regions where the adhesive layers 13 are not disposed in the thickness direction. The electromagnetic shielding member 14 is disposed in the lengthwise direction.

Figure 8:
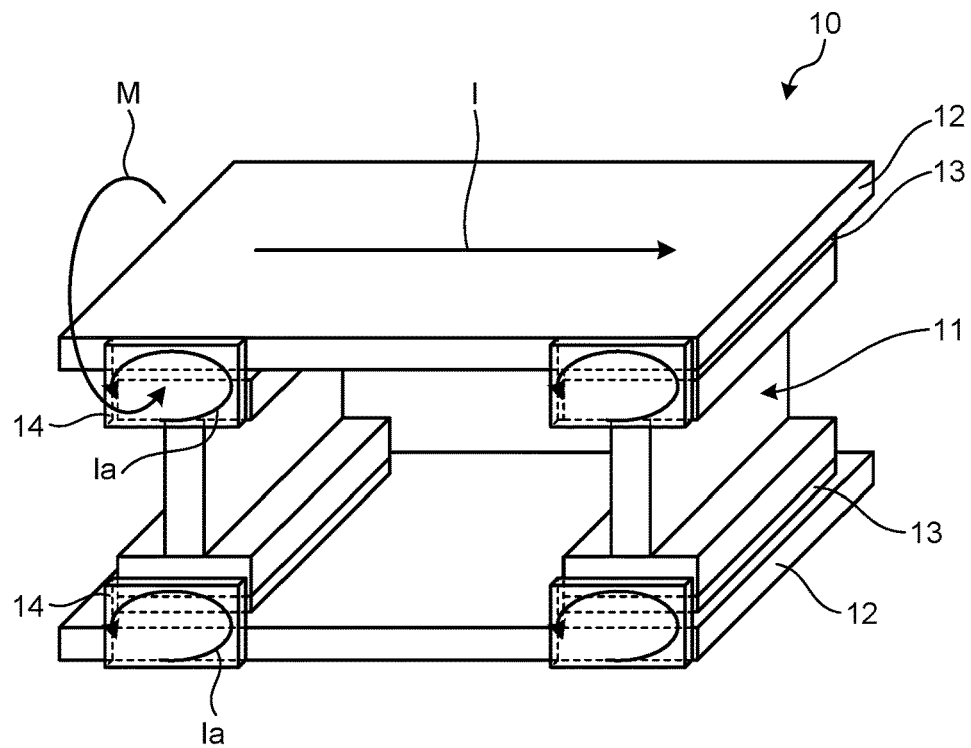
FIG. 8 is a schematic perspective view of an example of the composite material structure according to the first embodiment.

In FIG. 8, the electromagnetic shielding members 14 are disposed in the thickness direction in regions where the adhesive layers 13 are disposed, while not being disposed in regions where the adhesive layers 13 are not disposed in the thickness direction. The electromagnetic shielding members 14 are disposed in the lengthwise direction in regions where the adhesive layers 13 are disposed, while not being disposed in the lengthwise direction in regions where the adhesive layers 13 are not disposed. In other words, in FIG. 8, the electromagnetic shielding members 14 are disposed only in regions where the adhesive layers 13 are disposed.

Although the electromagnetic shielding members 14 are disposed in partial side faces in FIGS. 6 to 8, the electromagnetic shielding members 14 may be disposed in any manner so long as the electromagnetic shielding members 14 cover at least parts of the exposed areas of the adhesive layers 13. In FIGS. 6 to 8, the electromagnetic shielding members 14 may be made of a metal material having high conductivity or a magnetic material having high permeability.

Second Embodiment

Figure 9:
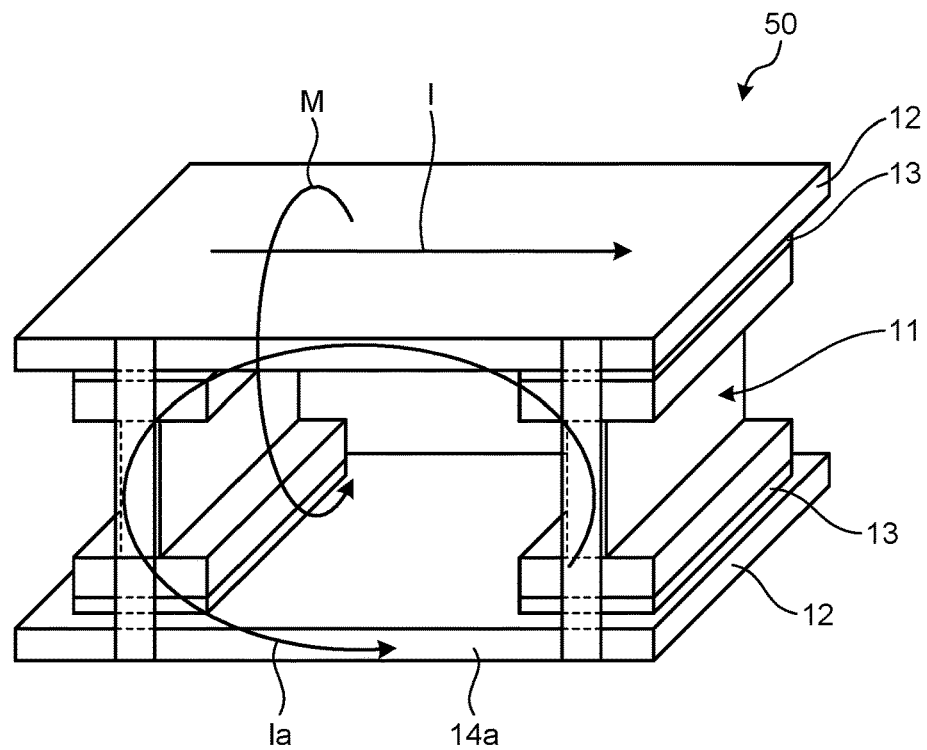
FIG. 9 is a schematic perspective view of an example of a composite material structure according to a second embodiment.
Figure 10:
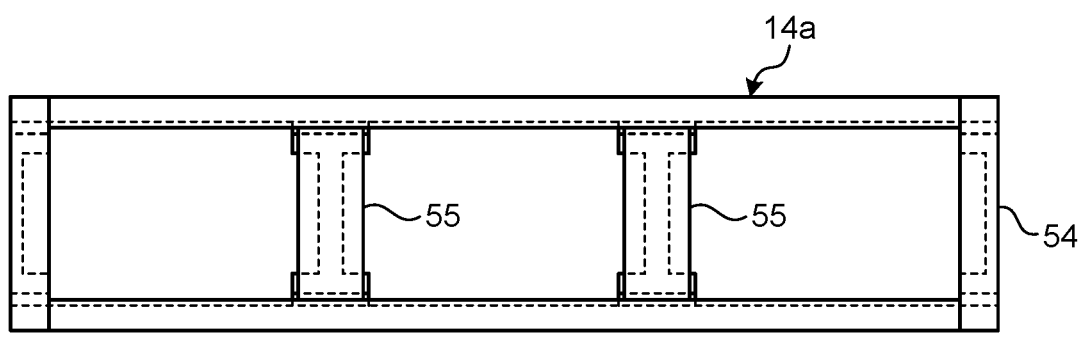
FIG. 10 is a schematic side view of an example of the composite material structure according to the second embodiment.
Figure 11:
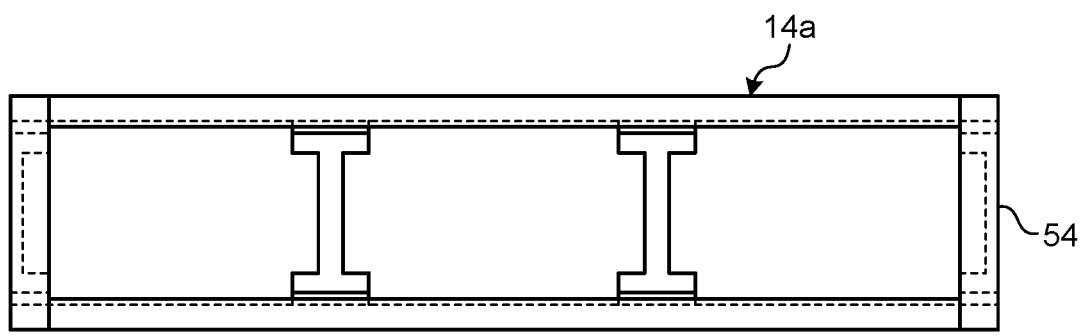
FIG. 11 is a schematic side view of an example of the composite material structure according to the second embodiment.

A second embodiment will now be described with reference to FIGS. 9 to 11. In order to avoid redundant description, the difference of the second embodiment from the first embodiment is described while the same components as those of the first embodiment are denoted with the same reference signs. FIG. 9 is a schematic perspective view of an example of a composite material structure according to the second embodiment. FIG. 10 and FIG. 11 are schematic side views of an example of the composite material structure according to the second embodiment.

Composite Material Structure

A composite material structure 50 according to the second embodiment includes electromagnetic shielding members 14a that are each annular in a side face of the composite material structure 50, instead of the electromagnetic shielding members 14 according to the first embodiment. The electromagnetic shielding members 14a each include a conductive material allowing the induced current Ia induced by the lightning current I to pass. The electromagnetic shielding member 14a is, for example, formed annularly in the side face in the lengthwise direction and the thickness direction to connect the adhesive layers 13. The electromagnetic shielding member 14a is annularly formed by a component disposed in the lengthwise direction of the first composite material member 11 and a component disposed in the thickness direction of the second composite material member 12. Thus, the induced current Ia induced by the lightning current I passes along the annular electromagnetic shielding member 14a.

Another example of the composite material structure 50 will now be described with reference to FIGS. 10 and 11. In FIG. 10, the electromagnetic shielding members 14a are disposed along the first composite material member 11 and the second composite material members 12. In other words, the electromagnetic shielding members 14a each include an annular component 54 within a side face, along the outer periphery, of the composite material structure 50 and bypass components 55 disposed in the annular component 54. The annular component 54 is annularly formed by a component disposed in the lengthwise direction of the first composite material member 11 and components disposed along the thickness direction of the second composite material member 12 on both outer sides. The bypass components 55 are disposed in the thickness direction of the inner second composite material members 12. Thus, in FIG. 10, a plurality of loops are formed by the electromagnetic shielding member 14a. In FIG. 11, the electromagnetic shielding member 14a has a configuration without the bypass components 55 in FIG. 10. In other words, the electromagnetic shielding member 14a in FIG. 11 includes only the annular component 54.

Third Embodiment

Figure 12:
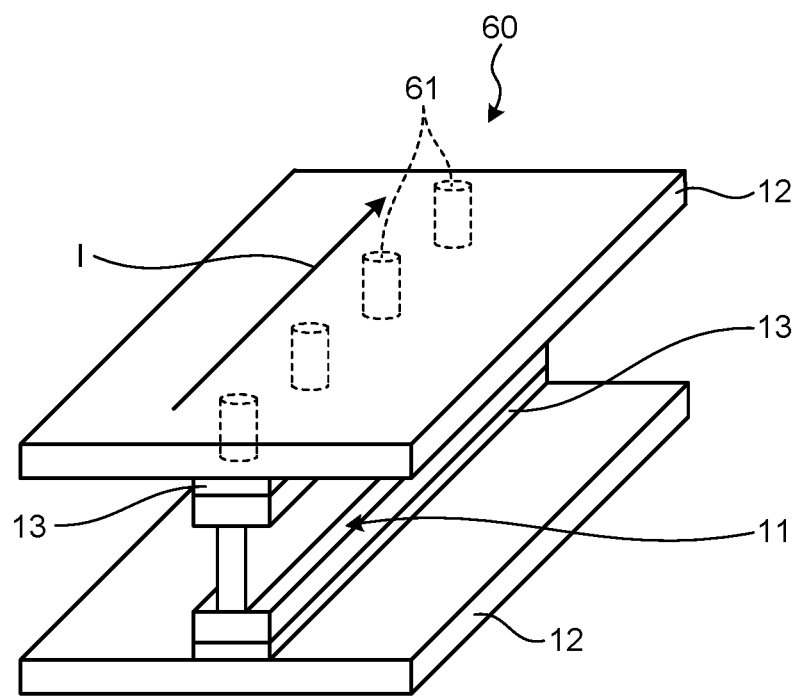
FIG. 12 is a schematic perspective view of an example of a composite material structure according to a third embodiment.

A third embodiment will now be described with reference to FIG. 12. In order to avoid redundant description, the difference of the third embodiment from the first and second embodiments are described while the same components as those of the first and second embodiments are denoted with the same reference signs. FIG. 12 is a schematic perspective view of an example of a composite material structure according to the third embodiment.

Unlike the composite material structures 10 and 50 according to the first and second embodiments, a composite material structure 60 according to the third embodiment includes a conductive joining member 61 electrically connecting the first composite material member 11 to the second composite material members 12.

The joining member 61 also functions as a member to fasten the first composite material member 11 and the second composite material members 12, which are joined via the adhesive layers 13. The joining member 61 is specifically a pin, a bolt, or a screw, and is made of a metal material. The joining member 61 has lower impedance than the first and second composite material members 11 and 12. A plurality of the joining members 61 are disposed at predetermined intervals in the lengthwise direction of the first composite material member 11, in other words, in the lightning current direction. The intervals are determined so as not to exceed a dielectric breakdown voltage of the adhesive layer 13. The plurality of joining members 61 are preferably disposed at equal intervals in the lengthwise direction of the first composite material member 11. The joining members 61 have a structural strength necessary and sufficient to allow the lightning current to pass. In order to reduce discharge from the exposed faces of the joining members 61, a seal member may be further disposed that covers the exposed area.

As described above, the composite material structures 10, 50, and 60 described in the embodiments are summarized, for example, as follows.

The composite material structure 10, 50, or 60 according to a first aspect includes: the first composite material members 11 including the first reinforcing fiber that is electrically conductive and impregnated with the first resin; the second composite material members 12 including the second conductive reinforcing fiber that is electrically conductive and impregnated with the second resin; the adhesive layers 13 each disposed between the first composite material member 11 and the second composite material member 12 to bond the first composite material member 11 to the second composite material member 12; and the electromagnetic shielding member 14 each covering at least part of an area, exposed to the exterior, of the adhesive layer 13. At least one of the first composite material member 11 and the second composite material member 12 has a predefined lightning current direction in which a lightning current generated by a lightning strike passes. The electromagnetic shielding member 14 is disposed over an entire plane of a side face serving as an end face of the composite material structure 10, 50, or 60 in a direction orthogonal to the lightning current direction.

According to this configuration, the electromagnetic shielding member 14 can reduce generation of a potential difference around the adhesive layer 13 even if, for example, a lightning strike causes the lightning current to pass, and an improvement in lightning resistance of the adhesive layers 13 can be achieved in a simple configuration. Since the electromagnetic shielding member 14 can be installed by retrofitting into the side face of the composite material structure 10, 50, or 60, an improvement in capability of the electromagnetic shielding member 14 for installation can be achieved.

In a second aspect, the electromagnetic shielding member 14 includes a conductive material allowing the induced current Ia induced by the lightning current I to pass.

According to this configuration, the electromagnetic shielding member 14 can form a path for the induced current Ia around the adhesive layer 13 and thus reduce generation of a potential difference around the adhesive layer 13.

In a third aspect, the electromagnetic shielding member 14 includes a magnetic material shielding the magnetic field M induced by the lightning current I.

According to this configuration, the electromagnetic shielding member 14 can reduce magnetic coupling and thus reduce generation of a potential difference around the adhesive layer 13.

In a fourth aspect, the first composite material member 11 extends in a lengthwise direction of the composite material structure, and the lightning current direction is in the lengthwise direction.

According to this configuration, the lengthwise direction of the first composite material member 11 can be designed as the lightning current direction. Thus, an improvement in lightning resistance of the adhesive layer 13 can be achieved according to a product specification.

In a fifth aspect, the electromagnetic shielding member 14 has a sheet-like shape and is disposed over the entire side face.

According to this configuration, an improvement in lightning resistance of the adhesive layer 13 can be surely achieved by the electromagnetic shielding member 14.

In a sixth aspect, the electromagnetic shielding member 14 is annular in the side face.

According to this configuration, a reduction in weight of the electromagnetic shielding member 14 can be achieved.

A seventh aspect further includes the conductive joining member 61 electrically connecting the first composite material member 11 to the second composite material member 12.

According to this configuration, the joining member 61 can electrically connect the first composite material member 11 to the second composite material member 12 to reduce a potential difference, even if the potential difference is generated around the adhesive layer 13 between the first composite material member 11 and the second composite material member 12.

In an eighth aspect, a plurality of the joining members 61 are disposed at predetermined intervals in the lightning current direction.

According to this configuration, the joining members 61 can more suitably reduce the potential difference around the adhesive layer 13.

REFERENCE SIGNS LIST 10, 50, 60 Composite material structure
11 First composite material member
12 Second composite material member
13 Adhesive layers
14, 14a Electromagnetic shielding members
31 Web 32 Flanges
41 Side panels
54 Annular components
55 Bypass components
61 Joining members

The invention claimed is:

1. A composite material structure comprising:
a first composite material member including a first reinforcing fiber electrically conductive and impregnated with a first resin;
a second composite material member including a second reinforcing fiber electrically conductive and impregnated with a second resin;
an entirely electrically insulating adhesive layer between the first composite material member and the second composite material member to directly bond the first composite material member to the second composite material member; and
an electromagnetic shielding member covering at least part of an area of the adhesive layer exposed to an exterior,
wherein at least one of the first composite material member and the second composite material member has a predefined lightning current direction in which a lightning current generated by a lightning strike passes,
wherein the electromagnetic shielding member is formed as a sheet over an entire side face of the composite material structure in a direction orthogonal to the lightning current direction,
wherein the electromagnetic shielding member includes:
a conductive material allowing a current induced by the lightning current to pass therethrough, and
a magnetic material shielding a magnetic field induced by the lightning current, and
wherein the electromagnetic shielding member is a separate component from the adhesive layer, and the electromagnetic shielding member is arranged to electrically connect the first composite material member and the second composite material member across the adhesive layer to reduce generation of a potential difference around the adhesive layer.

2. The composite material structure according to claim 1, further comprising a conductive joining member electrically connecting the first composite material member to the second composite material member.

3. The composite material structure according to claim 2, wherein the joining member is one of a plurality of joining members disposed at predetermined intervals in the lightning current direction.

4. The composite material structure according to claim 1, wherein the first composite material member extends in a lengthwise direction of the composite material structure, and the lightning current direction extends in the lengthwise direction.

* * * * *